United States Patent
Hopper et al.

(10) Patent No.: US 6,639,784 B1
(45) Date of Patent: Oct. 28, 2003

(54) WEDGE-SHAPED HIGH DENSITY CAPACITOR AND METHOD OF MAKING THE CAPACITOR

(75) Inventors: Peter Hopper, San Jose, CA (US); Philipp Lindorfer, San Jose, CA (US); Kyuwoon Hwang, Palo Alto, CA (US); Andy Strachan, Santa Clara, CA (US); Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/283,810

(22) Filed: Oct. 30, 2002

(51) Int. Cl.[7] ............................................. H01J 4/228
(52) U.S. Cl. ............................. 361/306.3; 361/306.1; 361/305; 257/303; 257/309; 257/310
(58) Field of Search ........................... 361/306.1, 306.3, 361/313, 305; 257/301, 303, 306, 310, 311, 309

(56) References Cited

U.S. PATENT DOCUMENTS

| | | | | |
|---|---|---|---|---|
| 4,810,669 A | * | 3/1989 | Kobayashi | 438/699 |
| 5,317,432 A | * | 5/1994 | Ino | 349/39 |
| 5,394,000 A | * | 2/1995 | Ellul et al. | 257/301 |
| 5,952,687 A | * | 9/1999 | Kawakubo et al. | 257/296 |
| 6,215,646 B1 | * | 4/2001 | Ochiai et al. | 361/301.4 |
| 6,437,387 B2 | * | 8/2002 | Gutsche | 257/301 |

* cited by examiner

Primary Examiner—Anthony Dinkins
(74) Attorney, Agent, or Firm—Stallman & Pollock LLP

(57) ABSTRACT

A capacitor structure is formed in a wedge-shaped trench by forming alternating layers of insulating material and conductive material in the trench such that each layer of conductive material formed in the trench is electrically isolated from adjacent layers of conductive material formed in the trench. A first electrical contact is formed to electrically link in parallel a first set of alternating layers of conductive material. A second electrical contact is formed to electrically link in parallel a second set of alternating layers of conductive material. The two electrically isolated sets of inter-linked layers of conductive material define the inter-digitated capacitor structure.

18 Claims, 3 Drawing Sheets

WEDGE-SHAPED HIGH DENSITY CAPACITOR AND METHOD OF MAKING THE CAPACITOR

TECHNICAL FIELD OF THE INVENTION

The present invention relates to capacitors utilized in integrated circuits and, in particular, to a wedge-shaped capacitor design that utilizes interdigitated conductive layers to form a high density capacitor with only one additional mask.

BACKGROUND OF THE INVENTION

Capacitors are commonly utilized in integrated circuits. As shown in FIG. 1, a conventional poly-poly dual plate capacitor 10 includes two overlapping polysilicon plates, i.e. an upper poly plate 12 and a lower poly plate 14, separated by a layer of dielectric material 16, typically silicon dioxide. Capacitance Cpp is the capacitance formed between the upper plate 12 and the lower plate 14. The lower poly plate 14 is separated from the underlying silicon substrate 18 by a layer of dielectric material 20, also typically silicon dioxide. The bottom plate forms a parasitic capacitance Cps with the substrate 18. As further shown in FIG. 1, an electrically charged well 22 is typically formed beneath the capacitor structure to prevent the coupling of signals to the substrate 18, thereby reducing the effective value of the parasitic capacitance Cps. As is well known, the well 22 must be reverse-biased in order to create a depletion region around the well-substrate junction.

The main disadvantage of all integrated capacitors, including poly-poly capacitors, is a relatively small capacitance Cpp per unit area that requires large expensive devices for even modest capacitance values. An additional problem of dual plate capacitors structures is the above-described unwanted parasitic capacitance Cps between the lower poly plate and the underlying silicon substrate that can affect circuit performance and couple noise to and from the substrate.

SUMMARY OF THE INVENTION

The present invention provides an interdigitated capacitor structure that is formed in a wedge-shaped trench. Alternating layers of insulating material and conductive material are formed in the trench such that each layer of conductive material in the trench is electrically isolated from adjacent layers of conductive material. A first electrical contact is formed to electrically link in parallel a first set of alternating layers of conductive material formed in the trench. A second electrical contact is formed to electrically link in parallel a second set of alternating layers of conductive material formed in the trench. The two sets of inter-linked layers of conductive material define the interdigitated capacitor structure.

The capacitor structure of the present invention can be fabricated within either the front end of the process. For example, the trench can etched into silicon, preferably during the deep or shallow trench etch stage of the process. Alternatively, the capacitor trench can be etched as an additional trench, for example into the inter layer dielectric (IDL) as part of the back end processing flow. The structure can be designed geometrically to provide maximum capacitance per unit area using only one additional mask. The structure is not coupled to the substrate, thereby eliminating the noise related with conventional capacitor structures.

The features and advantages of the present invention will be more fully appreciated upon consideration of the following detailed description and the accompanying drawings which set forth in illustrative embodiment in which the principles of the invention are utilized.

DETAILED DESCRIPTION OF THE INVENTION

Figure 1:
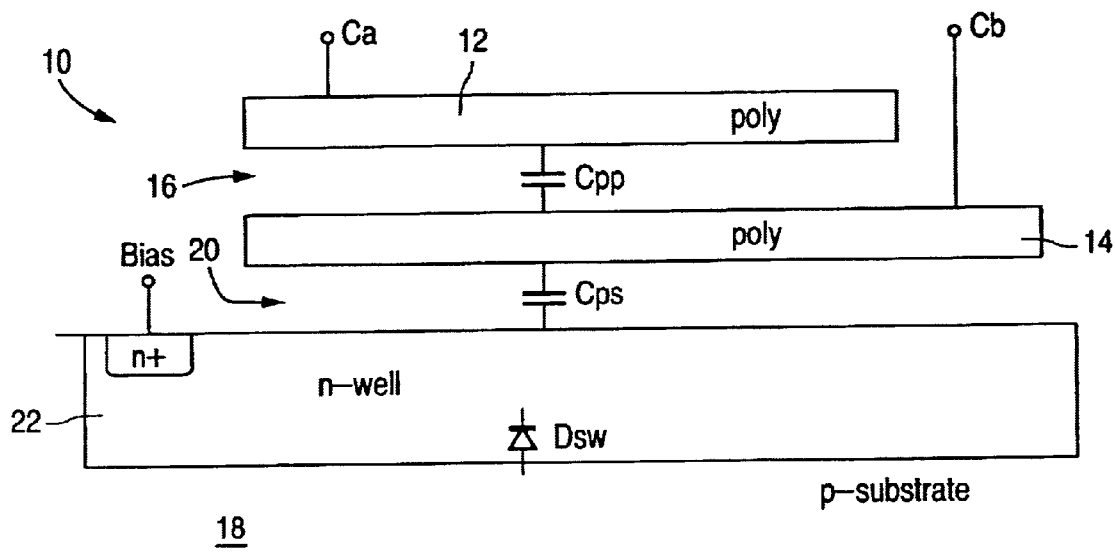
FIG. 1 is a partial cross-section drawing illustrating a conventional dual-plate capacitor structure.
Figure 2A:
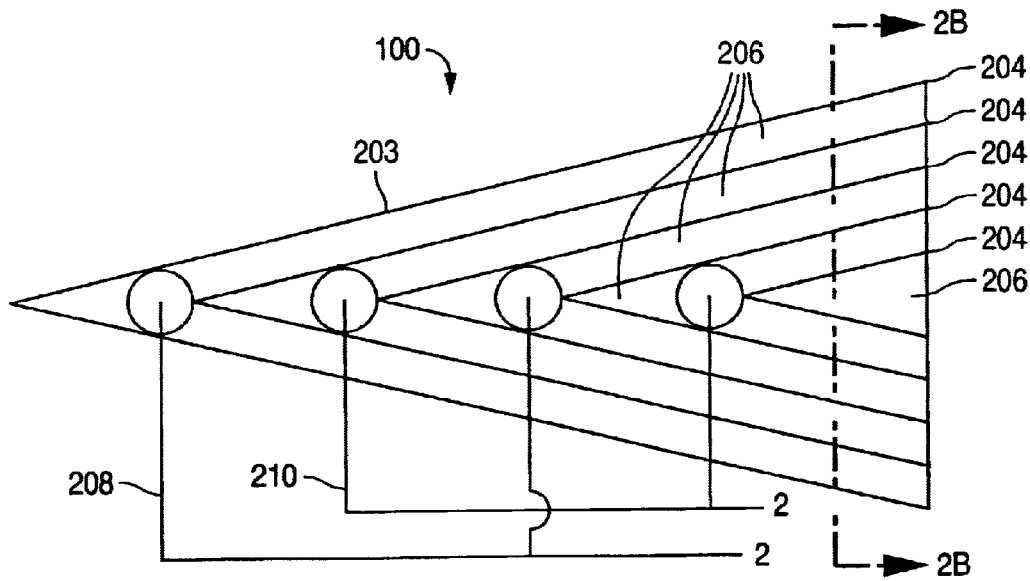
FIG. 2A is a plan view illustrating an embodiment of a wedge-shaped capacitor structure in accordance with the present invention.
Figure 2B:
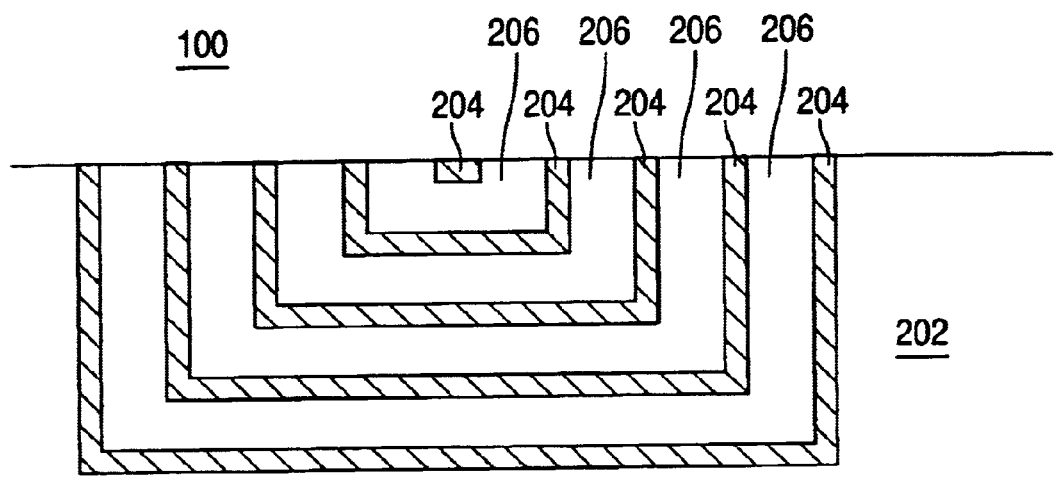
FIG. 2B is a cross-section view of a wedge-shaped capacitor structure in accordance with the present invention taken along line B—B in FIG. 2A.

FIGS. 2A and 2B show an embodiment of a capacitor structure 100 in accordance with the concepts of the present invention. The capacitor structure 100 is formed in a wedge-shaped trench 203 etched into a semiconductor material 202, for example, a silicon substrate. The wedge-shaped trench 203 has alternating layers of insulating material 204 (e.g. thermally grown silicon dioxide) and conducting material 206 (e.g. deposited polysilicon) formed in it such that each layer of conductive material 206 in the trench 203 is electrically isolated from adjacent layers of conductive material 206. It is noted that the layers of insulating material 204 are pictorially represented in FIG. 2A as a solid line, while in the FIG. 2B cross-section, the insulating layers 204 are shown more accurately as having a selected thickness. Those skilled in the art will appreciate that the thickness of the layers of insulating material 204 and conducting material 206 will depend upon the requirements of a particular circuit application. Those skilled in the art will also appreciate that the trench size may be selected to accommodate as many alternating layers of insulating material 204 and conducting material 206 as desired for a particular circuit application.

As further shown in FIGS. 2A, a first electrical contact 208 is formed to electrically link in parallel a first set of alternating layers of conductive material 206 formed in the trench. A second electrical contact 210 is formed to electrically link in parallel a second set of alternating layers of conductive material 206 formed in the trench. The two electrically isolated sets of alternating layers of conductive material define an interdigitated capacitor structure. Those skilled in the art will appreciate that the electrical contacts 208, 210 can be formed in accordance with any one of a number of techniques well known in the industry for forming electrical contacts to conductive layers.

While the embodiment of the invention described above with respect to FIGS. 2A and 2B is formed in a semiconductor material, for example, during the deep or shallow trench etch stage in the front end of the process flow, those skilled in the art will appreciate that a capacitor structure within the concepts of the present invention can also be formed in dielectric material, for example in the inter layer dielectric (IDL) as part of the back end of the process flow. Of course, if the capacitor structure is formed in dielectric material, then the first layer formed in the trench would be conducting material, followed by a layer of insulating material, and so on.

Figure 3A:
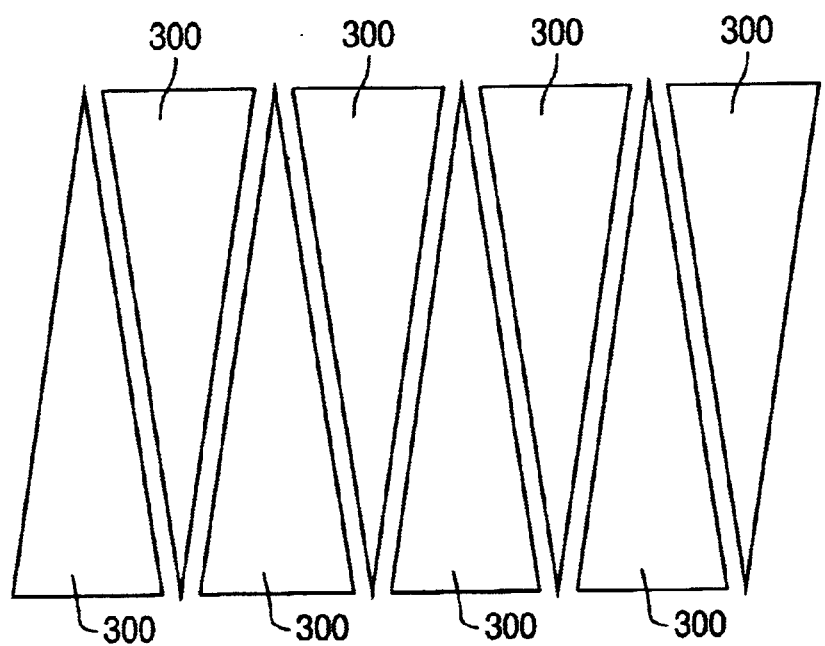
FIGS. 3A–3C illustrate a sequence of steps for fabricating a wedge-shaped capacitor structure in accordance with the present invention.

As discussed above, a process module for fabricating a capacitor structure in accordance with the present invention begins with the formation of a wedge-shaped trench, or as shown in the FIG. 3A plan view, a series of wedge-shaped trenches 300. The trenches 300 are masked by way of a wedge layout shape, each wedge in the FIG. 3A structure defining a trench 300. As stated above, the trenches 300 are preferably formed during the deep or shallow trench etch stage of the conventional process flow, but can also be formed at other stages of the overall process, e.g., as additional trenches etched into the inter layer dielectric (ILD) as part of the back end processing flow.

Figure 3B:
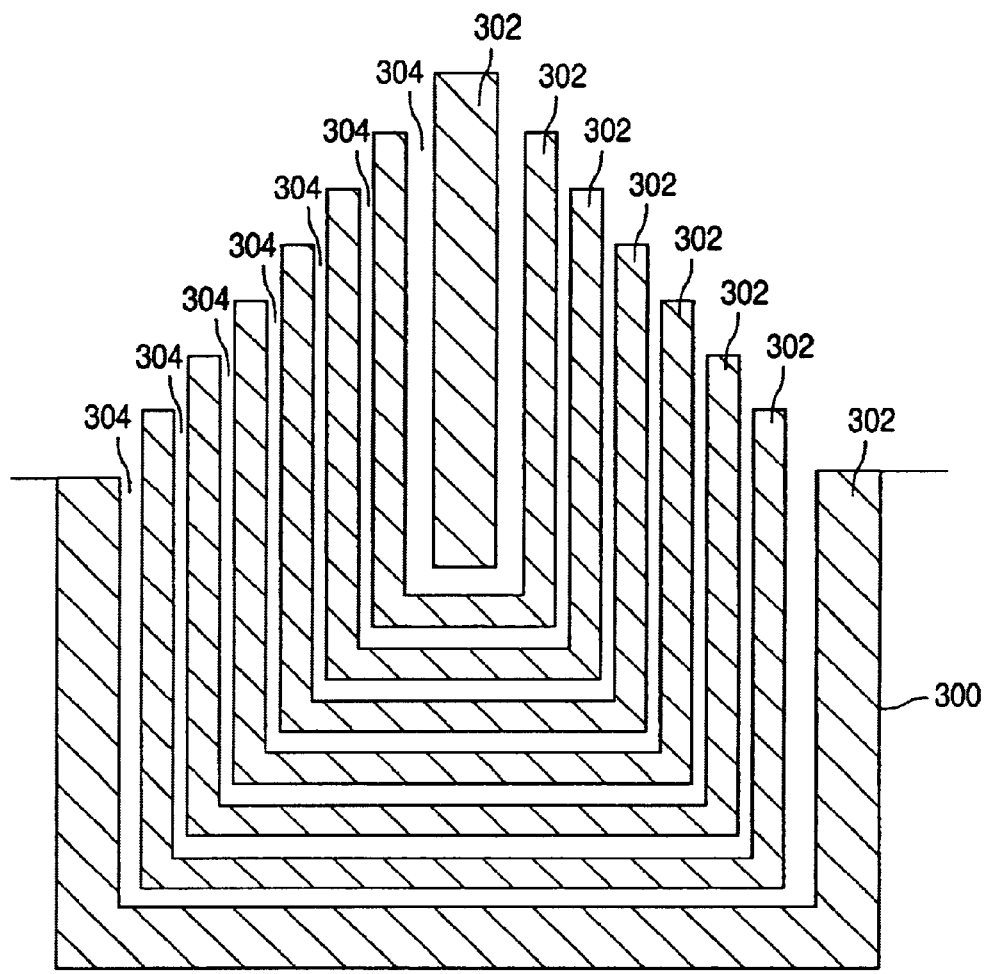

As shown in FIG. 3B, after formation of the trenches 300, a series of alternating steps takes place as insulator 302, conductor 304, insulator 302, conductor 304, insulator, conductor, etc. is formed. Of course, in the case of trench formation in dielectric, e.g. IDL, the series of alternation steps will comprise formation of conductor, insulator, conductor, insulator, etc. Those skilled in the art will appreciate that these alternating steps can include deposition and/or thermal growth steps as appropriate. As stated above, the process can include any number of iterations, depending upon the desired size of the capacitor structure and the application. The conductor material is typically polysilicon in the case of a silicon trench or metal, e.g. aluminum or any other metal or metal alloy commonly utilized in integrated circuit structures, in the case of an ILD etched trench. The insulator material can be any form of oxide, nitride, rare earth oxide or nitride material, typically used for capacitor dielectric isolation. After the completion of these sequences of the alternating deposition step, the wedge trench is filled.

Figure 3C:
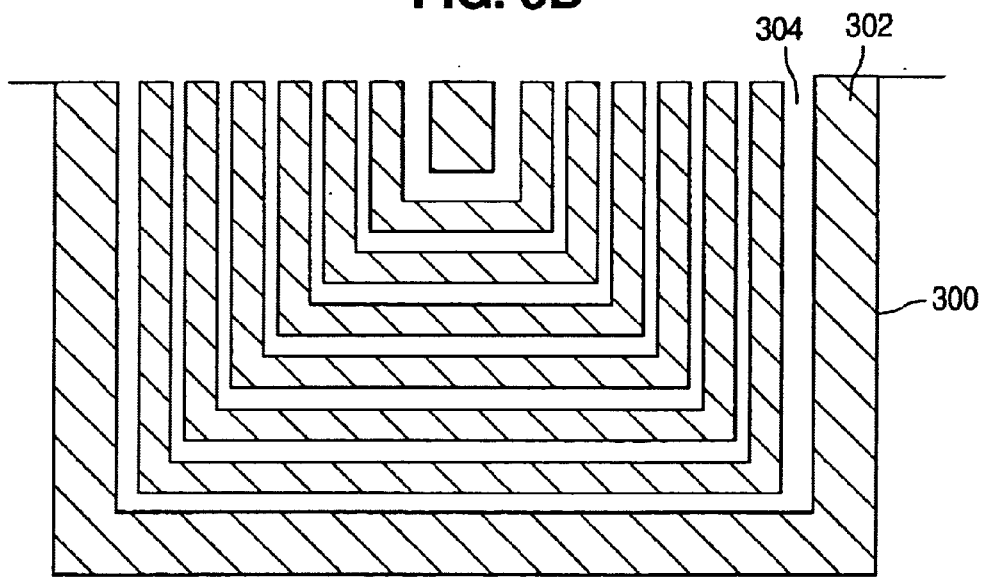

As shown in FIG. 3C, upon completion of the alternating deposition steps, a planarization step, for example, chemical mechanical polishing (CMP), follows. In the case of a silicon trench, the CMP will occur at the same time that conventional shallow trench isolation CMP is performed, using the shallow trench isolation etch nitride as a CMP stop. In the case of an ILD trench, CMP step is performed when the original ILD is being polished.

The above-described capacitor structure is designed geometrically to offer high capacitor density using only one additional mask. It can be used for in-line capacitors, and as part of a logic library to store energy so as to minimize dynamic IR drop issues. Also, applications may take the form of generalized high density capacitor applications, e.g. charge pumps. The present invention is guided by boundary conditions that include maximizing capacitance per unit area and providing a capacitor that is not coupled to the substrate with its attendant related noise issues, using one additional processing mask only, minimizing additional cost, and providing good voltage stability.

It should be recognized that a number variations of the above-identified embodiments of the invention will be obvious to one of skill of the art and in view of the foregoing description. Accordingly, of those specific embodiments and methods of present invention are shown and described herein, this invention is not to be limited by the specific embodiment. Rather, the scope of the invention is to be defined of the following claims and their equivalents.

What is claimed:

1. A capacitor structure comprising:
    a trench having a wedge-shaped layout formed in a host trench material;
    alternating layers of insulating material and conductive material formed in the trench such that each layer of conductive material in the trench is electrically isolated from adjacent layers of conductive material;
    a first electrical contact formed to electrically link in parallel a first set of alternating layers of conductive material formed in the trench; and
    a second electrical contact formed to electrically link in parallel a second set of alternating layers of conductive material formed in the trench
    whereby the first and second electrically isolated sets of alternating layers of conductive material define an interdigitated capacitor structure.

2. A capacitor structure as in claim 1, and wherein the host trench material comprises a semiconductor material.

3. A capacitor structure as in claim 2, and wherein the semiconductor material comprises silicon.

4. A capacitor structure as in claim 3, and wherein the insulating material comprises silicon oxide.

5. A capacitor structure as in claim 3, and wherein the conductive material comprises polysilicon.

6. A capacitor structure as in claim 1, and wherein the host trench material comprises a dielectric material.

7. A capacitor structure as in claim 6, and wherein he conductive material comprises metal.

8. A capacitor structure as in claim 7, and wherein the metal comprises aluminum.

9. A capacitor structure comprising:
    a plurality of adjacent trenches, each having a wedge-shaped layout, formed in a host trench material; and
    for each trench,
    (i) alternating layers of insulating material and conductive material formed in the trench such that each layer of conductive material in the trench is electrically isolated from adjacent layers of conductive material;
    (ii) a first electrical contact formed to electrically link in parallel a first set of alternating layers of conductive material formed in the trench; and
    (iii) a second electrical contact formed to electrically ink in parallel a second set of alternating layers of conductive material formed in the trench
    whereby the first and second electrically isolated sets of alternating layers of conductive material define an interdigitated capacitor structure.

10. A method of forming a capacitor structure, the method comprising:
    forming a trench having a wedge-shaped layout in a host trench material;
    forming alternating layers of insulating material and conductive material formed in the trench such that each layer of conductive material in the trench is electrically isolated from adjacent layers of conductive material;
    forming a first electrical contact formed to electrically link in parallel a first set of alternating layers of conductive material formed in the trench; and
    forming a second electrical contact formed to electrically link in parallel a second set of alternating layers of conductive material formed in the trench
    whereby the first and second electrically isolated sets of alternating layers of conductive material define an interdigitated capacitor structure.

11. A method as in claim 10, and wherein the host material comprises a semiconductor material.

12. A method as in claim 11, and wherein the semiconductor material comprises silicon.

13. A method as in claim 12, and wherein the insulating material comprises silicon oxide.

14. A method as in claim 12, and wherein the conductive material comprises polysilicon.

15. A method as in claim 10, and wherein the host trench material comprises a dielectric material.

16. A method as in claim 15, and wherein the conductive material comprises a metal.

17. A method as in claim 16, and wherein the metal comprises aluminum.

18. A method of forming a capacitor structure, the method comprising:

forming a plurality of adjacent trenches, each having a wedge-shaped layout, in a host trench material; and for each trench,
  (i) forming alternating layers of insulating material and conductive material formed in the trench such that each layer of conductive material in the trench is electrically isolated from adjacent layers of conductive material;
  (ii) forming a first electrical contact formed to electrically link in parallel a first set of alternating layers of conductive material formed in the trench; and
  (iii) forming a second electrical contact formed to electrically link in parallel a second set of alternating layers of conductive material formed in the trench whereby the first and second electrically isolated sets of alternating layers of conductive material define an interdigitated capacitor structure.

* * * * *